(12) United States Patent
Yang et al.

(10) Patent No.: US 10,312,887 B2
(45) Date of Patent: Jun. 4, 2019

(54) SELF-BIASING INTEGRATED OSCILLATOR WITHOUT BANDGAP REFERENCE

(71) Applicant: OmniVision Technologies, Inc., Santa Clara, CA (US)

(72) Inventors: Li Yang, Fremont, CA (US); Charles Qingle Wu, Palo Alto, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 120 days.

(21) Appl. No.: 15/365,605

(22) Filed: Nov. 30, 2016

(65) Prior Publication Data

US 2018/0152177 A1    May 31, 2018

(51) Int. Cl.

| | |
|---|---|
| H03B 5/24 | (2006.01) |
| H03K 3/36 | (2006.01) |
| H03K 4/50 | (2006.01) |
| H03K 3/011 | (2006.01) |
| H03K 3/012 | (2006.01) |
| H03K 3/037 | (2006.01) |
| H03K 3/354 | (2006.01) |
| H03K 3/0231 | (2006.01) |

(52) U.S. Cl.
CPC ............. *H03K 3/0231* (2013.01); *H03B 5/24* (2013.01); *H03K 3/011* (2013.01); *H03K 3/012* (2013.01); *H03K 3/037* (2013.01); *H03K 3/354* (2013.01); *H03K 3/36* (2013.01); *H03K 4/50* (2013.01)

(58) Field of Classification Search
CPC ...... H03K 4/502; H03K 3/0231; H03K 3/011; H03K 3/012; H03K 3/36; H03K 3/037; H03K 3/354; H03K 4/50; G06F 1/04; H03L 7/18; H03B 5/24

USPC ................... 331/111, 143; 327/291; 324/682
See application file for complete search history.

(56) References Cited

U.S. PATENT DOCUMENTS

| 8,988,157 B2 * | 3/2015 | Tokairin ................. H03K 4/502 |
| | | 331/1 R |
| 2015/0270832 A1 * | 9/2015 | Wang ................... H03K 3/0231 |
| | | 331/111 |

OTHER PUBLICATIONS

Boas et al. (2004) "A temperature compensated digitally trimmable on-chip IC oscillator with low voltage inhibit capability," In; The Proceedings of the 2004 International Symposium on Circuits and Systems, 2004. pp. 501-504.

(Continued)

*Primary Examiner* — Arnold M Kinkead
(74) *Attorney, Agent, or Firm* — Lathrop Gage LLP (57) ABSTRACT

An integrated oscillator has an R-S flipflop; a first and second capacitor; a current source transistor; first and second current-steering transistors, each having a source coupled to the current source transistor, with drains coupled to the first and second capacitor respectively. The first current-steering transistor has gate coupled to a first output of the R-S flipflop, and the second current-steering transistor has gate coupled to a second output of the R-S flipflop. The oscillator has a first sense inverter having input from the first capacitor and powered by a feedback circuit adapted to sense voltages on the first and second capacitor; and a second sense inverter having input from the second capacitor and powered by the feedback circuit. The R-S flipflop has a first input coupled to an output of the first sense inverter and a second input coupled to an output of the second sense inverter.

9 Claims, 5 Drawing Sheets

(56) References Cited

OTHER PUBLICATIONS

Choe et al. (2009) "A Precision Relaxation Oscillator with a Self-Clocked Offset-Cancellation Scheme for Implantable Biomedical SoCs," In; Solid-State Circuits Conference—Digest of Technical Papers, 2009. Session 23.7 pp. 401-403.
Sebastiano (2009) "A low-voltage mobility-based frequency reference for crystal-less ULP radios," IEEE Journal of Solid-State Circuits. 44(7):2002-2009.
Tokunaga et al. (2010) "An On-Chip CMOS Relaxation Oscillator with Voltage Averaging Feedback," IEEE Journal of Solid-State Circuits. 45(6):1150-1158.
Taiwan Patent Application No. 106141443, Office Action dated Aug. 17, 2018, with English translation, 8 pages.
Taiwan Patent Application No. 106141443, English translation of Office Action dated Dec. 13, 2018, 2 pages.

* cited by examiner

SELF-BIASING INTEGRATED OSCILLATOR WITHOUT BANDGAP REFERENCE

BACKGROUND

Many systems require oscillators, particularly those having two or more modules communicating with each other where an oscillator is often present in each module. For reliable serial communications, it is desirable that oscillators in communicating modules have good stability and operate reasonably close to a desired nominal operating frequency—for this reason, many modules incorporate crystal or ceramic resonator oscillators. Crystals and ceramic resonators, however, are expensive.

In order to avoid the expense of crystals and ceramic resonators, relaxation oscillators have been used, unfortunately these typically operate at low frequencies and require precision components such as external resistors and capacitors.

It is well known in the art that standard integrated circuit processing produces resistors and capacitors having significant process-related variation coupled with high temperature and voltage coefficients, although it is possible to make resistors and capacitors having fairly precise ratios. Further, transistor threshold voltages and saturation currents also often vary. While on-chip precision devices can be fabricated using additional resistance layers and laser-trimming, extra layers and laser-trimming add significant costs to integrated circuit manufacturing. For this reason, on-chip relaxation oscillators often use one or more external precision resistors and/or capacitors to determine operating frequency.

External precision resistors and/or capacitors not only add to system cost, but require circuit board area and dedicated pins on the integrated circuit to permit connection to these external parts. Further, typical relaxation oscillator designs operate at a lower frequency than is desirable in some applications.

SUMMARY

An integrated oscillator has an R-S flipflop; a first and second capacitor; a current source transistor; first and second current-steering transistors, each having a source coupled to the current source transistor, with drains coupled to the first and second capacitor respectively. The first current-steering transistor has gate coupled to a first output of the R-S flipflop, and the second current-steering transistor has gate coupled to a second output of the R-S flipflop. The oscillator has a first sense inverter having input from the first capacitor and powered by a feedback circuit adapted to sense voltages on the first and second capacitor; and a second sense inverter having input from the second capacitor and powered by the feedback circuit. The R-S flipflop has a first input coupled to an output of the first sense inverter and a second input coupled to an output of the second sense inverter.

DETAILED DESCRIPTION OF THE EMBODIMENTS

Figure 1:
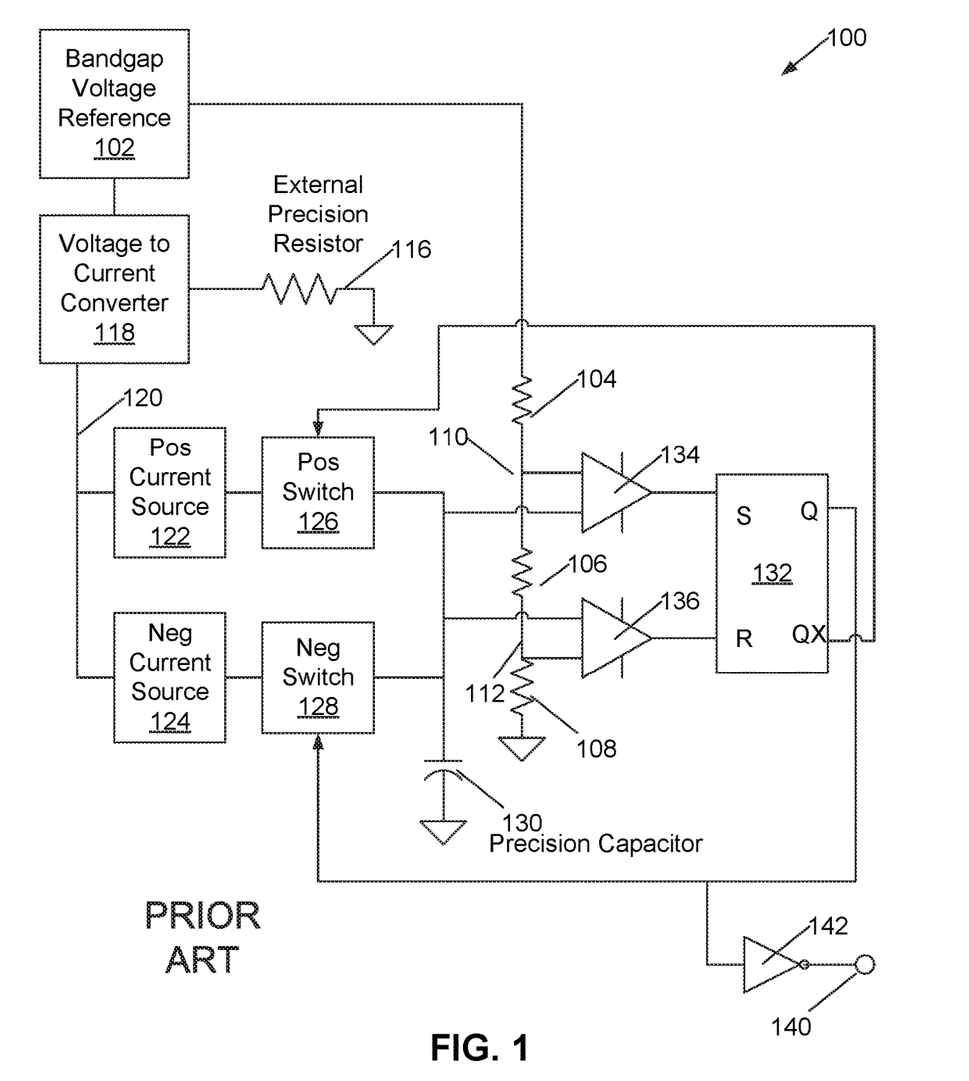
FIG. 1 is a block diagram of a PRIOR ART relaxation oscillator.

In the conventional oscillator 100 illustrated in FIG. 1, a bandgap reference 102 provides a stable reference voltage to a resistive voltage divider formed of resistors 104, 106, and 108 to provide an upper comparator reference voltage 110 and a lower comparator reference voltage 112. Typically the reference voltage is stable with temperature and supply voltage.

A reference voltage tapped from bandgap reference 102 also is provided to an external precision resistor 116 as part of a voltage-to-current converter 118 that provides a reference current 120. Reference current 120 controls a positive current source 122 and a negative current source 124.

Current from positive current source 122 is switched by positive switch 126 and admitted to capacitor 130 according to a state of an R-S flipflop 132, positive switch 126 is enabled when a negative switch 128 is disabled, and vice-versa. Current from negative current source 124 is admitted through negative switch 128 onto capacitor 130, the result is a sawtooth waveform on capacitor 130. Capacitor 130 provides input to two comparators, a positive comparator 134 and a negative comparator 136.

In operation, voltage on capacitor 130 rises as current from positive current source 122 and positive switch 126 until positive comparator 134 detects a higher voltage on capacitor 130 than upper comparator reference voltage 110, at which time the R-S flipflop 132 changes state. Voltage on capacitor 130 then falls as current from negative current source 124 through negative switch 128 is admitted onto capacitor 130 until negative comparator 136 detects a lower voltage on capacitor 130 than lower comparator reference voltage 112. An oscillator output 140 is tapped through an inverter 142 from either side of R-S flipflop 132. The intrinsic delay of comparator 134 and 136 significantly limits the oscillator speed.

An improved process-compensated oscillator 200 (FIG. 2) has a current-source transistor 202, controlled by a current source reference voltage VIR 203. Current from current-source transistor 202 is switched by first 204 and second 206 current steering transistors, into one of a first 208 and second 210 oscillator capacitors 208, 210; voltage on the first oscillator capacitor 208 forms a first oscillator voltage 212 and voltage on the second oscillator capacitor 210 forms a second oscillator voltage 214.

Figure 2:
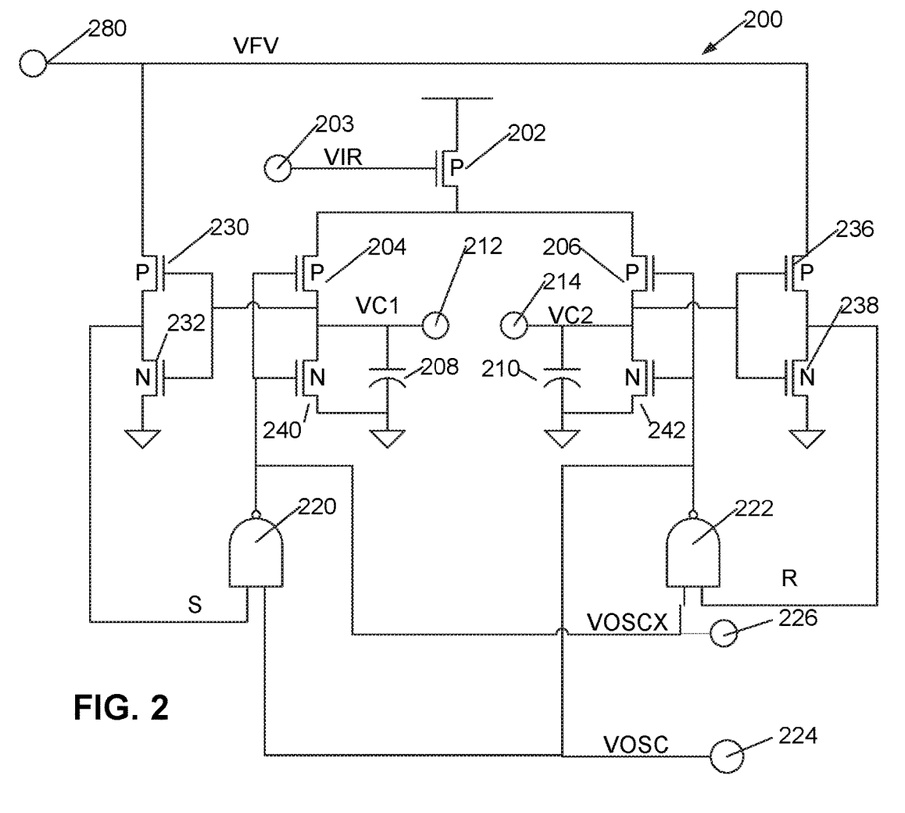
FIG. 2 is a block diagram of and embodiment of an oscillation subsystem for use with the bias system of FIG. 3 in an improved oscillator.

First 204 and second 206 current steering transistors are controlled by an R-S flipflop formed of a first 220 and second 222 NAND gate; outputs of first and second NAND gate are taken as the oscillator outputs 224 and 226. They are complementary outputs with an almost 50/50 duty cycle. In alternative embodiments, gates 220, 222, may be other than two-input NAND gates, for example one or both gate 220 or gate 222 may be an and-or-invert gate with an additional input configured to initialize the oscillator to a known state to permit testing of a system using the oscillator.

The first oscillator capacitor 208 voltage is sensed by a first controllable-threshold inverter formed of a P transistor 230 and an N transistor 232; the first controllable-threshold inverter is coupled to first NAND gate 220 as an active-low S or set input to the R-S flipflop formed by NAND gates 220 and 222.

Similarly, the second oscillator capacitor 210 voltage is sensed by a second controllable-threshold inverter formed of a P transistor 236 and an N transistor 238; the second controllable-threshold inverter is coupled to second NAND gate 222 as an active-low R or Reset input to the R-S flipflop formed by NAND gates 220 and 222.

An N-channel charge-dump transistor 240 is coupled to dump charge on first oscillator capacitor 208 when the R-S flipflop formed of NAND gates 220, 222 is in a first state, and an N-channel charge-dump transistor 242 is coupled to dump charge on second oscillator capacitor 210 when the R-S flipflop formed of NAND gates 220, 222 is in a second state.

The oscillator of FIG. 2 operates in conjunction with a bias subsystem 250 (FIG. 3) in an oscillator subsystem 249 (FIG. 4) with reference voltage (Vref) generator 251, a common mode feedback 253, and a differential amplifier and feedback voltage (VFV) generator 255.

Figure 3:
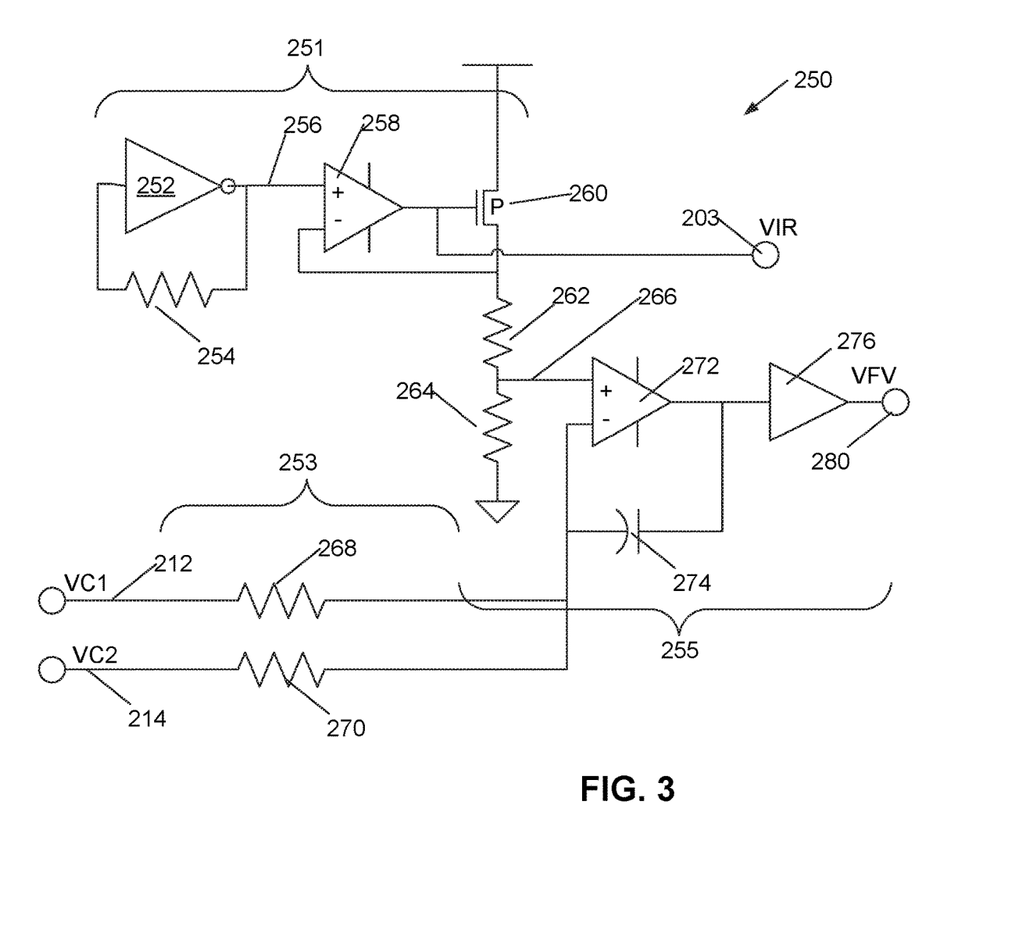
FIG. 3 is a block diagram of an embodiment of a bias subsystem for an improved oscillator.
Figure 4:
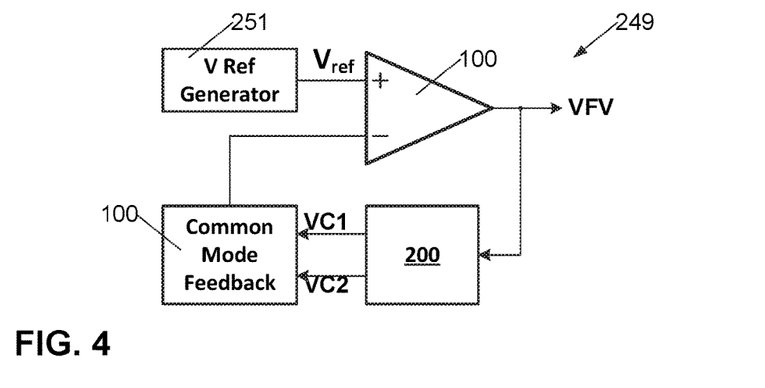
FIG. 4 is a block diagram of the oscillator showing the oscillation subsystem of FIG. 2 interconnected with the bias subsystem of FIG. 3.

In bias system 250, an inverter 252 having a resistor 254 coupled back to its input provides an output 256 at the trip point of the inverter 252, output 256 will vary according to threshold voltages of 252 and drain-source current characteristics of its constituent transistors as actually fabricated, thereby providing a voltage that tracks-process variations. Inverter 252 is a replica of the loop inverters consisting of transistor pairs 230/232 and 236/238. Output 256 is buffered by a unity-gain voltage buffer formed of a small amplifier 258 and P-type output transistor 260, this powers a voltage divider formed of resistors 262, 264; we note that while values of resistors 262, 264 are temperature sensitive and variable as much as 20% with process, the ratio of resistor 262 value to resistor 264 value in most integrated circuit processes can be controlled within one percent. The voltage divider formed by resistors 262, 264, has a divider output 266 that provides a targeted average voltage for the common-mode of differential signals VC1 212 and VC2 214 (FIG. 2).

First oscillator voltage 212 (VC1) and second oscillator voltage 214 (VC2) from oscillator 200 are summed and averaged by equal-value resistors 268, 270, (FIG. 3) and low-pass filtered by operation of amplifier 272 and capacitor 274 with a cutoff frequency determined by capacitor 274 and resistor 268 and 270. The filtered average voltage from the oscillator capacitors is effectively compared to divider output 266 by amplifier 272 and buffered by unity-gain buffer 276 to provide a feedback voltage VFV 280 that is fed back to control the oscillator's loop inverter threshold voltages. Amplifier 272 has an inverting input coupled to resistors 268, 270, and a noninverting input coupled to divider output 266.

Feedback voltage VFV 280 (FIGS. 2 and 3) controls oscillator frequency by adjusting supply voltage to first controllable-threshold loop inverter formed of P transistor 230 (FIG. 2) and N transistor 232, and to the second controllable-threshold loop inverter formed of P transistor 236 and N transistor 238. As supply voltage (VFV 280) of these loop inverters changes, the threshold voltage of loop inverters changes accordingly, which in turn changes the transition time point 306 and 308 of VC1 and VC2, respectively, thus adjusting output frequency in a negative feedback manner.

Output of amplifier 258 (FIG. 3), the amplifier of the unity-gain buffer that drives the resistive divider of resistors 262 and 264, is tapped to provide VIR 203. VIR is a bias voltage that operates the P-channel transistor 260 as a current source, and also operates P-channel transistor 202 (FIG. 2) as a current source to charge capacitors 208, 210. Capacitors 208 and 210 are metal-insulator-metal capacitor available in most CMOS processes with good voltage and temperature coefficient.

Figure 5:
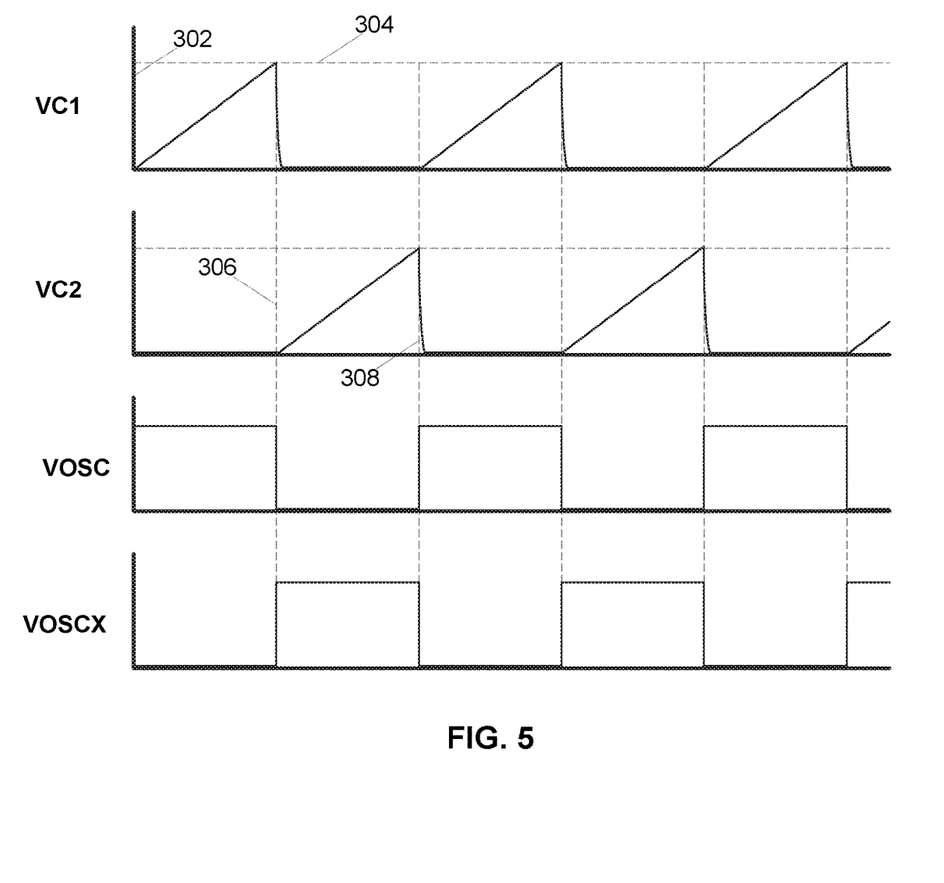
FIG. 5 is a waveform diagram illustrating voltages on the oscillator capacitors in the embodiment of FIG. 2.

The oscillator operates by linearly charging first capacitor 208 through p transistor 202, as shown as VC1 on FIG. 5 from an initial time 302 until voltage on capacitor 208 exceeds a threshold voltage 304 of the inverter formed of P device 230 (FIG. 2) and n device 232 as adjusted by feedback voltage VFV 280 at time 306, NAND gate 220 of the R-S flipflop changes state and oscillator output VOSCX 226 then switches. Switching of VOSCX 226 triggers NAND gate 222 of R-S flipflop to switch and thus changes state of VOSC 224. After VOSCX 226 switches at time 306, charge on first capacitor 208 is discharged through N device 240 and second capacitor 210 is charged linearly until voltage VC2 on capacitor 210 exceeds a threshold voltage 304 of the inverter formed of P device 236 (FIG. 2) and n device 238 as adjusted by feedback voltage VFV 280 at time 308; at which time the oscillator output VOSC 224 and VOSCX 226 switches again in a differential style. After VOSC 224 switches, charge on capacitor 210 is discharged through device 242 causing voltage VC2 on the capacitor to decay as first capacitor 208 is charged linearly. This cycle repeats.

Figure 6:
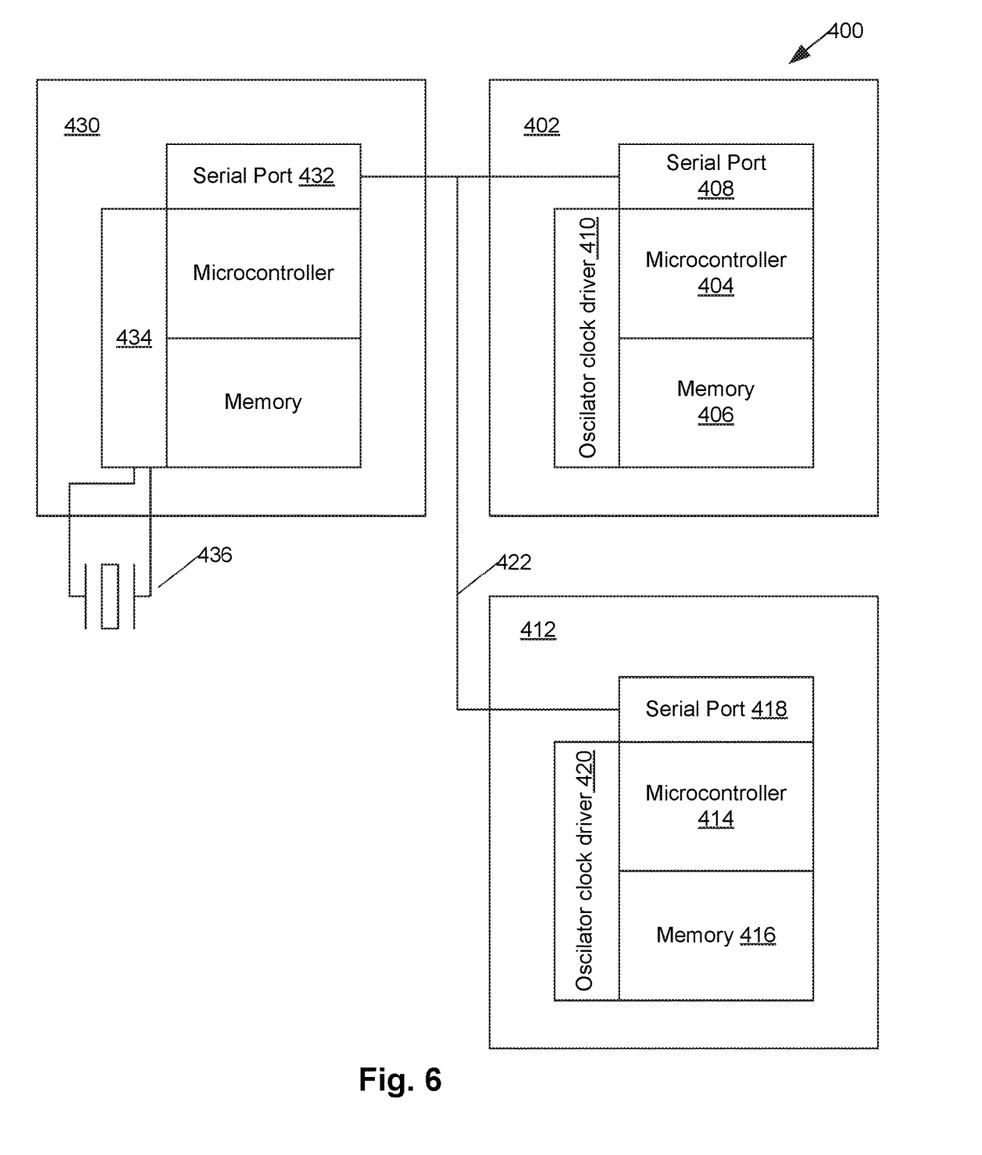
FIG. 6 is a block diagram of a system wherein integrated circuits embodying the oscillation subsystem may be used.

A system 400 incorporating embodiments of the herein-described oscillator is illustrated in FIG. 6. A first subsystem 402 has a small microcontroller 404 having a program memory 406 and a serial port 408, operating with timing provided by the fully-internal oscillator described with reference to FIG. 2 driving through a clock driver 410. Subsystem 402 has additional components that may or may not be on the same integrated circuit, in a first particular embodiment subsystem 402 includes a window actuator driver for a passenger-side window in a car, in a second particular embodiment subsystem 402 includes an electronic camera. Many other types of additional components may be used in subsystem 402, the first and second particular embodiment are merely examples.

System 400 also includes a second subsystem 412 having a small microcontroller 414 having a program memory 416 and a serial port 418, operating with timing provided by another oscillator as described with reference to FIG. 2 driving through a clock driver 410. Subsystem 412 has additional components that may or may not be on the same integrated circuit, in a first particular embodiment subsystem 412 includes a driver's side window and lock control panel for a car, in a second particular embodiment subsystem 412 includes an image-compression processor for use with an electronic camera. The stable oscillator-clock driver circuits 410, 420 allow subsystems 402, 412 to communicate using serial ports 418, 408 controlled by clock driver 410 over a serial network 422 despite process variations and changes in temperature, such that in the first particular embodiment window operation commands can be conveyed from the first subsystem to the second subsystem, and in the second particular embodiment raw uncompressed images can be transferred to the second subsystem for image compression. Similarly, a camera can synchronize image capture with a remote flash lighting system, System 400 may also have additional subsystems 430 where serial port 432 operates with timing controlled by an oscillator-clock driver 434 under control of a crystal or ceramic-resonator 436 because the oscillators of oscillator-clock drivers 410, 420 are sufficiently stable for operation with serial port 418, 408 over serial link 422.

In alternative embodiments, one or both of loop inverters 230/232, 236/238 are replaced by other type of digital gates, such as NAND gates, to provide extra functions, like reset and set functions as are useful for testing systems incorporating the oscillator; in other alternative embodiments loop NAND gates 220, 222 may be similarly replaced, for example with AND-OR-INVERT gates, to provide similar functions. In other embodiments, additional temperature compensation for resistor 262 and 264 is achieved by conventional diode-temperature-sensing.

Combinations

The oscillator described herein may be constructed in several variations. Among these are those described below.

In an embodiment designated A, an integrated oscillator has an R-S flipflop; a first and second capacitor; a current source transistor; first and second current-steering transistors, each having a source coupled to the current source transistor, with drains coupled to the first and second capacitor respectively. The first current-steering transistor has gate coupled to a first output of the R-S flipflop, and the second current-steering transistor has gate coupled to a second output of the R-S flipflop. The oscillator has a first sense inverter having input from the first capacitor and powered by a feedback circuit adapted to sense voltages on the first and second capacitor; and a second sense inverter having input from the second capacitor and powered by the feedback circuit. The R-S flipflop has a first input coupled to an output of the first sense inverter and a second input coupled to an output of the second sense inverter.

In an embodiment designated AA, including the integrated oscillator designated A wherein the first input of the R-S flipflop is an active-low SET input.

In an embodiment designated AB, including the integrated oscillator designated A or AA wherein the feedback circuit comprises a first differential amplifier having an inverting and a noninverting input, the inverting input coupled through a first resistor to the first capacitor and through a second resistor to the second capacitor, and a third capacitor coupled between the inverting input and an output of the differential amplifier.

In an embodiment designated AC, including the integrated oscillator designated A, AA, or AB wherein the gate of the first current source transistor is coupled to an output of a bias circuit comprising a reference inverter having input coupled to output, a second differential amplifier having a noninverting input coupled to the output of the reference inverter and an inverting input coupled to the output of the bias circuit.

An integrated oscillator designated AD including the integrated oscillator of designated A, AA, AB, or AC wherein the reference inverter has a threshold matched to the first sense inverter.

An integrated oscillator designated AE including the integrated oscillator designated A, AA, AB, AC, or AD wherein the R-S flipflop has at least one additional input configured to place the R-S flipflop in a known state for testing.

A method of generating a signal designated B comprising generating a first controlled current; switching the first controlled current onto a selected capacitor, the selected capacitor selected from the group consisting of a first capacitor and a second capacitor according to at least one output of an R-S flipflop; detecting a voltage on the first capacitor reaching an oscillator threshold voltage and switching a state of the R-S flipflop; and detecting a voltage on the second capacitor reaching the oscillator threshold voltage and switching the state of the R-S flipflop.

A method designated BA including the method designated B wherein the oscillator threshold voltage is a threshold voltage of an inverter comprising an N type transistor having source coupled to ground, gate coupled to input of the inverter, and drain coupled to output of the inverter, a P type transistor having source coupled to a control voltage, gate coupled to an input of the inverter, and drain coupled to the output of the inverter.

A method designated BB including the method designated BA wherein the control voltage is determined by a feedback control circuit having input from the voltage on the first capacitor and the voltage on the second capacitor.

A method designated BC including the method designated B, BA, or BB wherein the reference inverter is matched to a sense inverter that detects the voltage on the first capacitor.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween

What is claimed is:
1. An integrated oscillator comprising:
an R-S flipflop;
a first and a second capacitor;
a first current source transistor having a drain and a gate;
a first and a second current-steering transistor, each having a source coupled to the drain of the first current source transistor, a drain of the first current-steering transistor coupled to the first capacitor, and a drain of the second current-steering transistor coupled to the second capacitor, the first current-steering transistor having a gate coupled to a first output of the R-S flipflop, and the second current-steering transistor having a gate coupled to a second output of the R-S flipflop;
a first sense inverter having input coupled to the first capacitor, the first sense inverter being powered by a feedback circuit adapted to sense voltages on the first and second capacitor; and
a second sense inverter having input coupled to the second capacitor and powered by the feedback circuit;
wherein the R-S flipflop has a first input coupled to an output of the first sense inverter and a second input coupled to an output of the second sense inverter; and
wherein the first input of the R-S flipflop is an active-low SET input.

2. An integrated oscillator comprising:
an R-S flipflop;
a first and a second capacitor;
a first current source transistor having a drain and a gate;
a first and a second current-steering transistor, each having a source coupled to the drain of the first current source transistor, a drain of the first current-steering transistor coupled to the first capacitor, and a drain of the second current-steering transistor coupled to the second capacitor, the first current-steering transistor having a gate coupled to a first output of the R-S flipflop, and the second current-steering transistor having a gate coupled to a second output of the R-S flipflop;

a first sense inverter having input coupled to the first capacitor, the first sense inverter being powered by a feedback circuit adapted to sense voltages on the first and second capacitor; and a second sense inverter having input coupled to the second capacitor and powered by the feedback circuit;

wherein the R-S flipflop has a first input coupled to an output of the first sense inverter and a second input coupled to an output of the second sense inverter; and wherein the feedback circuit comprises a first differential amplifier having an inverting and a noninverting input, the inverting input coupled through a first resistor to the first capacitor and through a second resistor to the second capacitor, and a third capacitor coupled between the inverting input and an output of the differential amplifier.

3. The integrated oscillator of claim 2 wherein the gate of the first current source transistor is coupled to an output of a bias circuit comprising an reference inverter having input coupled to output, a second differential amplifier having a noninverting input coupled to the output of the reference inverter and an inverting input coupled to the output of the bias circuit.

4. The integrated oscillator of claim 3 wherein the reference inverter has a threshold matched to the first sense inverter.

5. The integrated oscillator of claim 2 wherein the R-S flipflop has at least one additional input configured to place the R-S flipflop in a known state for testing.

6. The integrated oscillator of claim 1 wherein the R-S flipflop has at least one additional input configured to place the R-S flipflop in a known state for testing.

7. A method of generating a signal comprising:

generating a first controlled current;

switching the first controlled current onto a selected capacitor, the selected capacitor selected from the group consisting of a first capacitor and a second capacitor according to at least one output of an R-S flipflop;

detecting a voltage on the first capacitor reaching an oscillator threshold voltage and switching a state of the R-S flipflop; and detecting a voltage on the second capacitor reaching the oscillator threshold voltage and switching the state of the R-S flipflop;

wherein the oscillator threshold voltage is a threshold voltage of a reference inverter comprising an N type transistor having source coupled to ground, gate coupled to input of the inverter, and drain coupled to output of the inverter, a P type transistor having source coupled to a control voltage, gate coupled to an input of the inverter, and drain coupled to the output of the inverter.

8. The method of claim 7 wherein the reference inverter is matched to a sense inverter that detects the voltage on the first capacitor.

9. The method of claim 7 wherein the control voltage is determined by a feedback control circuit having input from the voltage on the first capacitor and the voltage on the second capacitor.

* * * * *